United States Patent [19]

Schäfer et al.

[11] Patent Number: 5,591,488

[45] Date of Patent: Jan. 7, 1997

[54] PROCESS FOR TREATING PLASTIC SURFACES AND SWELLING SOLUTION

[75] Inventors: Claus Schäfer; Hermann-Josef Midekke, both of Berlin, Germany

[73] Assignee: Atotech Deutschland GmbH, Berlin, Germany

[21] Appl. No.: 411,752

[22] PCT Filed: Jul. 22, 1994

[86] PCT No.: PCT/DE94/00877

§ 371 Date: May 25, 1995

§ 102(e) Date: May 25, 1995

[87] PCT Pub. No.: WO95/04103

PCT Pub. Date: Feb. 9, 1995

[30] Foreign Application Priority Data

Jul. 30, 1993 [DE] Germany .................. 43 26 079.9

[51] Int. Cl.$^6$ .................. B05D 3/04; B05D 3/10
[52] U.S. Cl. .................. 427/307; 252/79.5; 427/98; 427/322
[58] Field of Search .................. 427/307, 322, 427/98, 123, 125; 252/79.1, 79.5

[56] References Cited

U.S. PATENT DOCUMENTS 3,898,136  8/1975  Yonemitsu et al. .................. 204/30
4,775,557  10/1988  Bastenbeck et al. .................. 427/307
5,049,230  9/1991  Patel et al. .................. 156/628

FOREIGN PATENT DOCUMENTS

3740369A1    6/1989   Germany .
3922477A1    1/1991   Germany .
WO85/05755  12/1985   WIPO .
WO89/10431  11/1989   WIPO .

OTHER PUBLICATIONS

Documents 86/052916/08; 86/007337, Jan., 1986.

Primary Examiner—Michael Lusignan
Attorney, Agent, or Firm— Cohen, Pontani, Lieberman, Pavane

[57] ABSTRACT

The invention is directed to a process for treating polymer-containing workpiece surfaces and to an aqueous non-aging solution. In addition to the swelling agents used for swelling, alkalizing agents and basic salts, the solution applied in the process contains at least one solubilizer for the swelling agent in the solution which is selected from the group of organic compounds having the general formula HO—A(OH)—R, where A represents a branched or unbranched alkane chain, R represents a branched or unbranched alkyl group or hydrogen, and A and R together contain at least three carbon atoms. The process and the swelling solution can be used for metallizing polymers.

17 Claims, No Drawings

PROCESS FOR TREATING PLASTIC SURFACES AND SWELLING SOLUTION

BACKGROUND OF THE INVENTION

1. Field of the Invention

The invention is directed to a process for treating polymer-containing workpiece surfaces and to an aqueous non-aging solution.

2. Description of the Prior Art

Plastics can be coated with metals by wet-chemical processes according to various methods. Conventionally, the polymer surfaces are hydrophilized and roughened and then rendered conductive so that metal can be electrodeposited. Until a few years ago, it was conventional to seed the prepared surface with a catalytically active metal for this purpose and then to deposit a metal, usually copper, by chemical reduction from a suitable bath. In the meantime, processes have been applied which allow metal plating directly without electroless baths. An electrically conducting layer is produced instead of the catalytically active activator. This layer may comprise metal, e.g., palladium, but generally comprises a metal chalcogenide, a carbon layer produced from a carbon suspension, or an electrically conducting polymer, e.g., polypyrrole.

The following polymers are used as plastics: epoxy resin, polycarbonate, poly(phenylene oxide), polyester, polyamide, polyimide, poly(ether imide), polystyrene, poly(vinyl chloride) or acrylonitrile-butadiene-styrene copolymers (ABS).

In the fabrication of printed circuit boards in electronics, double-sided printed circuit boards or multilayer circuits require that the walls of the drilled through-holes be coated with metal so as to make contact between the metallic layers and to join wired components by soldering. For this purpose the applied metal layer should adhere securely to the printed circuit board dielectric and to already existing metal, e.g., the metal lining, and the inner layers of multilayer circuits, and should withstand the soldering process in particular.

A strong bonding between the plastic substrate and the metallic cover layer is also necessary in decorative metallization of plastic articles. This is equally true for functional metallization of articles, e.g., for shielding against electromagnetic radiation.

The strong bonding between the deposited metal and the polymer substrate and accordingly the functional quality of the workpiece to be produced is determined chiefly by the type of preconditioning process and the materials employed in this process. Usually, the first process step consists in swelling the polymer matrix. The second process step consists of an oxidative etching step which degrades and accordingly roughens the polymer matrix. Acceptable etching media are alkaline permanganate solution or chromic acid. However, other processes are known in which pretreatment consists only of swelling the substrate and not treating it in an oxidative etching solution.

Micro-roughening of the polymer substrate is required particularly for the preconditioning of through-holes in printed circuit board material so that deposited metal can adhere well. In order to clean through-holes smeared with polymers when drilled, an etching medium such as alkaline permanganate solution can remove drilling dust and smeared polymer material; however, micro-roughening is only achieved when the printed circuit board polymer has been swollen with an appropriate swelling solution prior to the etching step.

Swelling solutions generally contain water, an organic swelling agent and, usually, a substance reacting alkaline in water. As a rule, the organic swelling agents employed have high boiling points and only limited miscibility with water. Aqueous solutions of ethylene glycol derivatives are usually used for swelling polymers.

U.S. Pat. No. 3,898,136 describes the surface treatment of articles of epoxy resin and poly(phenylene oxide) resin with solvents having the general formula $RO(AO)_nR'$, where R or R' represent an alkyl group or acyl group with not more than four carbon atoms and the other group represents a hydrogen atom, an alkyl group or acyl group with not more than four carbon atoms, A represents a branched or unbranched $C_2$- to $C_4$-alkene group, and n represents a whole number from 1 to 4, followed by etching to achieve a strong bonding of the substrate and the subsequently applied metal layer.

In DE-A 37 40 369, the swelling agent is combined with an inorganic or organic base which promotes the swelling action by hydrolyzing polar chemical bonds of the polymer.

U.S. Pat. No. 4,775,557 describes the pretreatment of polycarbonates with compounds having the general/formula $R_1(OCH_nH_{2n})_m-R_2$, where $R_1$ and $R_2$ represent independently aryl groups or alkyl groups with 1 to 4 carbon atoms, n=2–4 and m=1–5, and the subsequent etching treatment to achieve good coverage of the polymer surface with metal to be deposited subsequently and a good bonding strength.

WO 89/10431 describes a swelling solution containing an organic solvent which is immiscible with water, where a homogeneous, clear solution is obtained by adding a surface-active substance. The disadvantage in using surface-active substances consists in that the swelling solutions containing these compounds generally foam considerably, which limits their applicability.

U.S. Pat. No. 5,049,230 describes a pretreatment process for polymers for subsequent etching in which mixtures of organic compounds which etch the polymer without attacking it are used in an alkaline medium. Organic compounds, e.g., lower alcohols such as methanol, ethanol, isopropanol, alkanolamines and phenolamines, tertiary amines, carboxylic acids, etc., are used to solubilize the components.

WO 85/05755 describes a swelling solution containing compounds having the general formula $R_1O-C-(CH_2)_m-C-OR_2$ and $R_3-(OCH_2CH_2)_nO-R_4$, where $R_1$, $R_2$, $R_3$ and $R_4$ independently represent either hydrogen atoms, aryl groups or alkyl groups with 1 to 4 carbon atoms, m=0–2 and n=2–5. Preferred compounds are propylene glycol monomethyl ether and propylene glycol monopropyl ether or tetraethylene glycol in alkaline solution.

The processes and pretreatment solutions mentioned above have the disadvantage that at higher temperatures, particularly when accompanied by a high content of alkalizing agents such as alkali hydroxides, the swelling solution separates since, by reacting with the carbon dioxide contained in the air, the alkalizing agents change into carbonates which are poorly soluble in the swelling solution. The chemical reaction taking place is described by the following reaction equation:

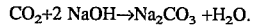

$$CO_2 + 2\ NaOH \rightarrow Na_2CO_3 + H_2O.$$

One of the liquid phases occurring in the separation of the solution mostly contains the swelling agent, while the other consists predominantly of water. The higher the operating temperature and the higher the concentration of alkali hydroxide in the swelling solution, the faster the formation of the carbonates promoting the separation of the swelling agent. Therefore, after a determined operating time, the solution must either be diluted with water and replenished with fresh solvent or it must be discarded completely.

Another known possibility for allaying these problems consists in liberating the swelling solution of its salt content or operating at a lower temperature so that separation only occurs after a longer period of operation. However, these measures are cumbersome, costly and harmful to the environment since valuable raw materials are consumed, the treatment installations are not available for treating the product during the required maintenance periods, and large amounts of raw materials which present disposal problems must be discarded.

The disadvantages mentioned above have been tolerated in the past, but it is not economical to work with the known swelling agents for the reasons given above, since these agents are not resistant to aging.

SUMMARY OF THE INVENTION

Therefore, the object of the present invention is to avoid the disadvantages of the prior art, provide suitable compounds and optimize the pretreatment process also for difficult applications.

The present invention is therefore directed to a non-aging aqueous solution for treating polymer-containing workpiece surfaces, wherein the solution comprises at least one suitable organic swelling agent, alkalizing agent, basic salt and at least one solubilizer for the swelling agent in the solution. The solubilizer is represented by the formula

HO—A(OH)—R where A represents a branched or unbranched alkane chain, R represents a branched or unbranched alkyl group or hydrogen, and A and R together have at least three carbon atoms.

The present invention is also directed to a process for treating polymer-containing workpiece surfaces wherein the process comprises the step of swelling the workpiece surfaces with the non-aging aqueous solution.

The process according to the invention uses aqueous, non-aging solutions for swelling polymer-containing workpiece surfaces, which solutions contain organic swelling agents suitable for swelling, alkalizing agents, basic salts, in particular alkali carbonates and, in addition, at least one solubilizer for the swelling agents in the solution.

Organic compounds having the general formula

HO—A(OH)—R are used as solubilizers according to the invention, where A represents a branched or unbranched alkane chain, R represents a branched or unbranched alkyl group or hydrogen, and A and R together have at least three carbon atoms.

Preferred compounds are those in which A contains two to six carbon atoms and R represents an alkyl group with fewer than four carbon atoms or hydrogen.

Surprisingly, it has been found that certain alcohols effectively prevent the separation of the aqueous swelling solutions. Some of these compounds are listed in the following table along with the measured separation temperature. The swelling solution contained 210 g/l diethylene glycol monobutyl ether, 20 g/l sodium hydroxide, 10 g/l sodium carbonate and a solubilizer in water. The concentrations of the tested solubilizers contained in the swelling solution were 80 g/l in each instance.

TABLE

| solubilizer | Separation temperatures separation temperature (°C.) |
|---|---|
| without solubilizer | 42° C. |
| 1,2,3-propanetriol | 40° C. |
| 1-hexanol | <52° C. |
| ethylene glycol | 52° C. |
| ethanolamine | 54° C. |
| 1,6-hexanediol | 55° C. |
| triethylene glycol | 58° C. |
| 2,2-dimethyl-1,3-propanediol | 62° C. |
| 1,2-propanediol | 68° C. |
| 1,5-pentanediol | 68° C. |
| 1,4-butanediol | 70° C. |
| 1,3-butanediol | 73° C. |
| 1,2-butanediol | 78° C. |

The results show that the diols of propane, butane and pentane are particularly effective as solubilizers, while compounds such as ethylene glycol, 1, 2, 3-propanetriol, 1-hexanol, ethanolamine and triethylene glycol are not sufficiently effective. In the described solution, it was possible to increase the operating temperature from 42° C. to a maximum of 78° C. without separation of the solution when using the compounds according to the invention. With 1,2-butanediol, a swelling solution also containing 30 g/l sodium hydroxide still showed no separation even at 70° C. However, the separation temperature is also dependent on the concentrations of other ingredients in the swelling solution. Therefore, swelling solutions with higher alkali contents and higher operating temperatures enable pretreatment of polymers in a substantially shorter time than was previously possible, without separation of the swelling solution.

It has been discovered that operating temperatures for the swelling solution in excess of 60° C. and, in particular between 60° C. and 90° C., are especially effective. Therefore, the separation temperature of the swelling solution should likewise exceed this value. According to the invention, the following compounds are particularly well-suited as solubilizers, since they increase the separation temperature to values above 60° C.: 2, 2-dimethyl-1,3-propanediol, 1,2-propanediol, 1,5-pentanediol, 1,4-butanediol, 1,3-butanediol and 1,2-butanediol.

The concentration of solubilizers in the swelling solution ranges from 10 g/l to 500 g/l, preferably from 50 g/l to 200 g/l, depending on requirements. Decisive criteria for this are the upper operating temperature of the swelling solution and the concentrations of alkali hydroxides and the resulting formation of alkali carbonates in the swelling solution. The higher the operating temperature and the higher the concentration of alkali hydroxide and carbonate contained in the swelling solution, the higher the concentrations of solubilizer needed in the swelling solution. On the other hand, an extremely high content of solubilizers must be avoided when seeking to prevent an uneconomically prolonged treatment of the polymers so that costs for raw materials and waste water treatment can be kept as low as possible. For this reason, the concentration preferably ranges from 50 g/l to 200 g/l.

Compounds of the formula $R_1O—(A'O)_p—R_2$ can be used as swelling agents, where $R_1$ and $R_2$ are selected independently and represent alkyl groups or acyl groups with not more than five carbon atoms, aryl groups or hydrogen and, at most, one of the two groups is hydrogen, A' represents a carbon group with two to five carbon atoms, and $p = 1, 2, 3$ or 4. $R_1$ and $R_2$ can be identical or different groups.

The choice of swelling agent is governed by the kind of substrate material to be treated. When applied in printed circuit board engineering in which epoxy resin is pretreated as substrate, diethylene glycol monobutyl ether is used, for instance. For pretreatment of thermoplastics such as polycarbonates or mixtures thereof with ABS, ether esters such as diethylene glycol monoethyl ether acetate are suitable.

Various compounds may be used as alkalizing agents. Apart from the alkali hydroxides which are favored because of their low cost, quaternary ammonium bases can be used for this purpose. When the swelling solution comes into contact with air and reacts with the carbon dioxide contained therein, these compounds form the corresponding carbonates as basic salts. The velocity of the reaction between alkalizing agent and carbon dioxide, and accordingly the rate of carbonate formation, depends on the temperature of the swelling solution, the contacting surface between the swelling solution and air and accordingly on the manner in which the solution is moved (standing solution in immersion tank, spraying or splashing of solution, possible injection of air into the swelling solution) and on the concentration of alkalizing agent.

Since the treatment time depends on the operating temperature of the swelling solution, it is adjusted on the basis of the process conditions. Further, the operating temperature is determined by the type of polymers to be treated, the swelling agent used, the concentration of alkalizing agent and other factors. Temperature is preferably set above 60° C. The upper temperature limit depends on the boiling point of the swelling agent in the swelling solution and the lower temperature limit depends on the desired treatment time. The higher the temperature, the shorter the selected treatment time can be. Moreover, it must be taken into account that the evaporation losses of the swelling agent and the energy consumption at high temperatures is appreciably greater than at lower temperatures. Therefore, a temperature range between approximately 60° C. and 90° C. is preferred in order to reach a compromise between an excessively short treatment period and excessively high evaporation losses of the swelling agent and to determine the onset of separation of the swelling solution.

The swelling solution according to the invention can be brought into contact with the material to be treated in various ways. Normally, the polymer is dipped in the solution. Alternatively, the swelling solution can also be applied to the polymer surface by spraying, splashing or injecting.

Following the swelling treatment in the solution according to the invention, the polymer is generally subjected to a roughening treatment in an etching solution. Solutions containing alkaline permanganate solutions or chromic acids are preferably used for this purpose. Depending on the polymers to be treated, however, it may also be advantageous to treat the polymer only in the swelling solution and not in the etching solution.

For metallization, the polymer workpiece surfaces are subsequently subjected to the following process steps, known per se: conditioning (pretreatment for subsequent activation with compounds which improve seeding); when necessary, etch-cleaning of existing metal surfaces such as the copper surfaces on printed circuit boards (cleaning); activation (seeding for electroless metallization of the precious metal-containing solutions) and metallization. For this purpose, conventional electroless processes can be used, in which a first conductive metal layer is first precipitated from metal baths working without external current and then electroplating is carried out, or direct electroplating can be carried out without the use of electroless metal baths. Optional metals, e.g., copper, nickel or precious metals, can be deposited.

A preferred use of the solution according to the invention is for pretreating drilled holes in printed circuit boards for subsequent metallization. In this case, adequate microroughening of the through-hole wall is required.

However, the solution according to the invention can also be used for pretreatment of polymers which are subsequently metallized for decorative or functional purposes. Typical applications for functional coating are the shielding of housings against electromagnetic radiation, e.g., computer monitors and radio equipment. Decorative applications include the manufacture of costume jewelry, sanitary appliances, furniture hardware and automobile accessories.

The following examples serve to illustrate the present invention:

EXAMPLE 1

A swelling solution of 100 g/l diethylene glycol monobutyl ether, 150 g/l 1,4-butanediol and 50 g/l sodium hydroxide, with water making up the remainder, was heated to 80° C. Drilled FR4 printed circuit board material (flame-resistant epoxy resin-fiberglass material, e.g., Ciba Geigy AG supplier) was swollen for 5 min in the completely clear solution, rinsed with water for 1 min and then etched for 5 min in a solution of 70 g/l sodium permanganate and 50 g/l sodium hydroxide. $MnO_2$ formation on the surface was removed after a subsequent rinsing process by reducing with an acidic hydrogen peroxide solution. A subsequent examination of the resin surface in the through-hole by scanning electron microscopy (SEM) showed a defect-free, very uniform micro-roughening of the polymer.

EXAMPLE 2

In a horizontally operating installation for fabricating printed circuit boards, an aqueous swelling solution with 100 g/l diethylene glycol monobutyl ether, 150 g/l 1,4-butanediol and 50 g/l sodium hydroxide was used in a first step. The operating temperature was 80° C. A residence time of 40 seconds for the printed circuit board in the swelling solution was calculated from the through-rate of 0.6 m/min. In the second treatment step, a permanganate solution containing approximately 50 g/l potassium permanganate, 9 g/l potassium manganate and 45 g/l sodium hydroxide was used. $MnO_2$ formation on the surface was removed by an aqueous solution of hydroxyl ammonium sulfate. Test boards were examined by SEM after this reduction. The polymer surface showed the desired micro-roughening.

EXAMPLE 3

Injection molded articles for furniture hardware and computer monitor housings made of Bayblend FR1441 plastics (trade name of Bayer AG for plastics with a mixture of polycarbonate and an acrylonitrile-butadiene-styrene copolymer) were treated for 5 min at 60° C. with an aqueous swelling solution of 100 g/l diethylene glycol monoethyl ether acetate, 150 g/l 1,4-butanediol, 20 g/l sodium carbonate and 50 g/l sodium hydroxide. After rinsing for 1 min in tap water, the articles were hydrophilized at 70° C. in a solution of 140 g/l sodium permanganate and 40 g/l sodium hydroxide. After an additional rinsing step, $MnO_2$ formation was removed in a solution of sulfuric acid and hydrogen peroxide, the surfaces were catalyzed with a commercially available ionic palladium-containing activator, as is conventional, and were then coated with copper by reduction. After reinforcing the formed copper layer to an approximate thickness of 30 μm by electrodeposition, the achieved bonding strength of the copper on the articles was determined with a commercial tensile test machine and standardized peeling strips. Values of 0.3 N/mm were measured.

EXAMPLE 4

The polymer was treated in the manner indicated in Example 3. However, poly(ether imide) was used instead of Bayblend. Mean bonding strengths of 0.6 N/ram were achieved.

EXAMPLES 5 to 8

The polymers were treated in the manner indicated in Examples 1 to 4. However, 20 g/l sodium carbonate were added to the swelling solution in each instance to simulate absorption by sodium hydroxide of carbon dioxide from the air. The solutions also remained clear at 80° C. No difference in the micro-roughening of the polymer was evidenced compared with the results indicated in Examples 1 to 4.

EXAMPLE 9

Printed circuit boards provided with through-holes were metallized under the conditions indicated in Example 2. In this case, the circuit boards were multilayer circuits with four layers. After metallization, the test samples of the printed circuit boards were judged by cross section before and after a solder shock test (six cycles of 10 seconds each in tin-lead solder at 288° C. and a cooling phase). No cracks or other defects were found on the metallized inner layers. Nor were there any defects such as pocket voids which occur due to penetration of the swelling solution in the polymer and evaporation during solder shock. The resin and glass fibers were covered with metal in a faultless manner.

COMPARISON EXAMPLE 10

The swelling solution indicated in Example 2 was prepared without 1,4-butanediol and without sodium carbonate and was clear. The solution was used at 80° C. for treating printed circuit boards. After formation of sodium carbonate due to aging of the swelling solution, the solution became cloudy and the swelling agent, diethylene glycol monobutyl ether, formed a second liquid phase in addition to the aqueous phase. The solution had to be discarded. COMPARISON EXAMPLE 11

The swelling solution indicated in Example 2 was prepared only with 10 g/l sodium hydroxide, but without 1,4-butanediol and without sodium carbonate, and was clear. The swelling solution was used at 80° C. for treating printed circuit boards. The micro-toughening of the resin surfaces after treating with permanganate was extraordinarily slight compared with the results indicated in comparison example 10. At some locations on the walls of the through holes, no micro-roughening at all could be detected. It should be understood that the preferred embodiments and examples described are for illustrative purposes only and are not to be construed as limiting the scope of the present invention which is properly delineated only in the appended claims.

What is claimed is:

1. A process for treating polymer-containing workpiece surfaces, comprising the step of swelling the workpiece surfaces with a non-aging aqueous solution comprising effective swelling amounts of at least one suitable organic swelling agent, alkalizing agent, basic salt and at least one solubilizer for the swelling agent in the solution, wherein the solubilizer is an organic compound of the formula

HO—A(OH)—R, where A represents a branched or unbranched alkane chain, R represents a branched or unbranched alkyl group or hydrogen, and A and R together contain at least three carbon atoms.

2. The process according to claim 1, wherein the basic salts comprise alkali carbonates.

3. The process according to claim 1, comprising the additional step of adjusting the temperature of the aqueous solution to at least 60° C.

4. The process according to claim 1, wherein the polymer is at least one of epoxy resin, polycarbonate, poly(phenylene oxide), polyester, polyamide, polyimide, poly(ether imide), polystyrene, poly(vinyl chloride) or acrylonitrile-butadiene-styrene copolymers, or mixtures thereof.

5. The process according to claim 3, wherein the temperature of the aqueous solution is adjusted to between 60° C. and 90° C.

6. A process for metallizing polymer-containing workpiece surfaces, comprising the steps of:
   (a) swelling the workpiece surfaces with a non-aging aqueous solution comprising effective swelling amounts of at least one suitable organic swelling agent, alkalizing agents, basic salts and at least one solubilizer for the swelling agent in the solution, wherein the solubilizer is an organic compound of the formula HO—A(OH)—R, wherein A represents a branched or unbranched alkane Chain, R represents a branched or unbranched alkyl group or hydrogen and A and R together contain at least three carbon atoms;
   (b) roughening the surfaces in an etching solution, where appropriate;
   (c) activating the surfaces; and
   (d) metallizing the activated surfaces.

7. The process according to claim 6, wherein the etching solution of step (b) includes solutions containing alkaline permanganate solution or chromic acid.

8. An aqueous non-aging solution for treating polymer-containing workpiece surfaces and for the metallization of such surfaces, the solution comprising effective swelling amounts of at least one suitable organic swelling agent, alkalizing agent, basic salt and at least one solubilizer, wherein the solubilizer is an organic compound of the formula

HO—A(OH)—R, where A represents a branched or unbranched alkane chain, R represents a branched or unbranched alkyl group or hydrogen, and A and R together contain at least three carbon atoms.

9. The solution according to claim 8, wherein A has two to six carbon atoms.

10. The solution according to claim 8, wherein R represents an alkyl group with fewer than four carbons atoms or is hydrogen.

11. The solution according to claim 8, wherein the solubilizer is a compound or a mixture of compounds selected from the group consisting of 2,2-dimethyl-1,3-propanediol, 1,2-propanediol, 1,5-pentanediol, 1,4-butanediol, 1,3-butanediol and 1,2-butanediol.

12. The solution according to claim 8, wherein the concentration of solubilizers in the solution is between 10 g/l and 500 g/l.

13. The solution according to claim 8, wherein the basic salt comprises alkali carbonates.

14. The solution according to claim 8, wherein the organic swelling agent is represented by the formula $$R_1O\text{—}(A'O)_p\text{—}R_2$$

where $R_1$ and $R_2$ are selected independently and represent alkyl groups or acyl groups with not more than five carbon atoms, aryl groups or hydrogen, and where, at most one of the two groups is hydrogen, A' represents a carbon group with two to five carbon atoms, and p =1,2, 3 or 4.

15. The solution according to claim 8, wherein the organic swelling agent is diethylene glycol monobutyl ether or diethylene glycol monoethyl ether acetate.

16. The solution according to claim 8, wherein the alkalizing agent comprises alkali hydroxide.

17. The solution according to claim 12, wherein the concentration of solubilizers in the solution is between 50 g/l and 200 g/l.

* * * * *